(12) United States Patent
Ohse et al.

(10) Patent No.: US 12,080,762 B2
(45) Date of Patent: Sep. 3, 2024

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Naoyuki Ohse, Nagano (JP); Makoto Utsumi, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 211 days.

(21) Appl. No.: 17/566,333

(22) Filed: Dec. 30, 2021

(65) Prior Publication Data

US 2022/0262905 A1 Aug. 18, 2022

(30) Foreign Application Priority Data

Feb. 17, 2021 (JP) .................... 2021-022958

(51) Int. Cl.
*H01L 29/45* (2006.01)
*H01L 23/00* (2006.01)
(Continued)

(52) U.S. Cl.
CPC .......... *H01L 29/1608* (2013.01); *H01L 24/48* (2013.01); *H01L 29/456* (2013.01);
(Continued)

(58) Field of Classification Search
CPC ......... H01L 21/02529; H01L 21/02378; H01L 21/02447; H01L 29/1608; H01L 29/66053;
(Continued)

(56) References Cited

U.S. PATENT DOCUMENTS 6,521,515 B1 * 2/2003 Kluth ................ H01L 21/28518
438/257
6,955,978 B1 * 10/2005 Woodin .................. H01L 29/45
257/E29.104

(Continued)

FOREIGN PATENT DOCUMENTS

JP 2000-164593 A 6/2000
JP 3083301 B2 9/2000

OTHER PUBLICATIONS

"Annealing Effects on Al and AN-Si Contacts with 3C—SiC" by Hiroshi Diamon et al. in Japanese Journal of Applied Physics, vol. 25, No. 7, Jul. 1986, pp. L592-L594 (Year: 1986).*

(Continued)

*Primary Examiner* — Eric A. Ward
(74) *Attorney, Agent, or Firm* — Rabin & Berdo, P.C.

(57) ABSTRACT

A silicon carbide semiconductor device, including a semiconductor substrate containing silicon carbide, a bonding wire, and a surface electrode of an aluminum alloy containing silicon, the surface electrode being provided on a surface of the semiconductor substrate, and having a joint portion to which the bonding wire is bonded. The surface electrode has a plurality of silicon nodules formed therein, which include a number of the silicon nodules formed in the joint portion. One of the number of the silicon nodules is of a dendrite structure, and is included at an area percentage of at least 10% relative to a total area of the number of the silicon nodules in the joint portion.

8 Claims, 7 Drawing Sheets

(51) Int. Cl.
*H01L 29/16* (2006.01)
*H01L 29/66* (2006.01)

(52) U.S. Cl.
CPC .............. *H01L 29/66053* (2013.01); *H01L 2224/48245* (2013.01)

(58) Field of Classification Search
CPC ... H01L 29/066068; H01L 2224/05124; H01L 2924/01013; H01L 2924/10272
See application file for complete search history.

(56) References Cited

U.S. PATENT DOCUMENTS

| | | | |
|---|---|---|---|
| 7,109,116 B1* | 9/2006 | Purtell | H01L 21/28518 438/682 |
| 2006/0273323 A1* | 12/2006 | Yamamoto | H01L 21/0485 257/77 |
| 2009/0117716 A1* | 5/2009 | Shimomura | H01L 21/76254 257/E21.52 |
| 2016/0380068 A1* | 12/2016 | Nobukuni | H01L 24/00 257/652 |
| 2018/0174840 A1* | 6/2018 | Joshi | H01L 29/0692 |

OTHER PUBLICATIONS

"Improved Al/Si ohmic contacts to p-type 4H—SiC" to Roumen Kakanakov et al. in Materials Science and Engineering B80 (2001) 374-377 (Year: 2001).*

"Influence of temperature on the properties of sputtered AlSiCu films" by W. De Bosscher et al. in Applied Surface Science 73 (1993) 295-304 (Year: 1993).*

Goto, Hiroshi, et al., "High Strength Al-alloy Electrode Material for Si-IGBT", (Research and Development, Kobe Steel Engineering Reports), Kobelco, Sep. 2015, vol. 65, No. 2, pp. 58-61.

* cited by examiner

PRISMATIC STRUCTURE

FIG.5B

PRISMATIC STRUCTURE

FIG.5C

PRISMATIC STRUCTURE

FIG.5D

DENDRITE STRUCTURE

FIG.6

| SUBSTRATE TEMPERATURE DURING AlSi ELETRODE DEPOSITION | MORPHOLOGY OF Si NODULE | PRISMATIC PERCENTAGE | PRISMATIC HEIGHT | DENDRITE PERCENTAGE | DENDRITE HEIGHT | PEELING |
|---|---|---|---|---|---|---|
| 350 | PRISMATIC | 100% | 5μm (MAXIMUM) | 0% | — | YES |
| 400 | PRISMATIC | 100% | 5μm (MAXIMUM) | 0% | — | YES |
| 410 | PRISMATIC +DENDRITE | 98%-100% | 3μm (MAXIMUM) | ≤2% | ≤1μm | YES |
| 420 | PRISMATIC +DENDRITE | 95%-100% | >2μm BUT ≤3μm | ≤5% | ≤1μm | YES |
| 430 | PRISMATIC +DENDRITE | ≤90% | 2μm (MAXIMUM) | ≥10% | ≤1μm | NO |
| 440 | PRISMATIC +DENDRITE | ≤20% | 2μm (MAXIMUM) | ≥80% | ≤1μm | NO |
| 450 | DENDRITE | 0% | — | 100% | ≤1μm | NO |
| 500 | DENDRITE | 0% | — | 100% | ≤1μm | NO |

FIG.7

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-022958, filed on Feb. 17, 2021, the entire contents of which are incorporated herein by reference.

BACKGROUND OF THE INVENTION

1. Field of the Invention

Embodiments of the invention relate to a silicon carbide semiconductor device and method of manufacturing a silicon carbide semiconductor device.

2. Description of the Related Art

Aluminum (Al) containing silicon (Si) is conventionally used as an electrode material of a surface electrode on a front surface of a semiconductor substrate. The surface electrode on the front surface of the semiconductor substrate is formed so as to be embedded in a contact hole of an interlayer insulating film. Therefore, as a method of enhancing embeddability of a surface electrode using aluminum containing silicon as an electrode material (hereinafter, AlSi electrode), for example, reflow sputtering for softening and embedding has been proposed and includes performing a heat treatment (reflow) while performing deposition (formation) by sputtering.

In an instance in which silicon (Si) is used as a semiconductor material, mutual diffusion of silicon atoms in the semiconductor substrate and aluminum atoms in the AlSi electrode easily occurs when the semiconductor substrate and the AlSi electrode are in contact with each other. The aluminum atoms that diffuse into the semiconductor substrate from the AlSi electrode alloy with the silicon atoms in the semiconductor substrate, forming protrusions (alloy spikes) that locally protrude from the AlSi electrode into the semiconductor substrate. When the alloy spikes proceed to a pn junction in the semiconductor substrate, there is a concern of device element defects due to degradation of characteristics.

The silicon atoms that diffuse into the AlSi electrode from the semiconductor substrate are deposited as silicon (Si) nodules near an interface between the AlSi electrode and the semiconductor substrate, whereby electrical resistance at the interface between the semiconductor substrate and the AlSi electrode increases. It is known that by setting a temperature of the semiconductor substrate to be a relatively low temperature (less than about 300 degrees C.) during the sputtering for the AlSi electrode, mutual diffusion of the silicon atoms in the semiconductor substrate and the aluminum atoms in the AlSi electrode is suppressed, thereby suppressing progression of alloy spikes and the deposition of Si nodules.

Further, in instances in which, for example, an aspect ratio of the contact hole of the interlayer insulating film is large, a method is used in which tungsten (W), which has a higher embeddability than that of aluminum, is embedded in the contact hole of the interlayer insulating film by a chemical vapor deposition (CVD) method. The AlSi electrode is deposited on a tungsten plug (W plug) embedded in the contact hole of the interlayer insulating film, whereby the AlSi electrode and the semiconductor substrate are not in direct contact with each other, thereby suppressing the generation of alloy spikes.

On the other hand, in an instance in which silicon carbide (SiC) is used as a semiconductor material, even when the temperature of the semiconductor substrate during the sputtering for the AlSi electrode is set to at least 300 degrees C., alloy spikes are not easily generated. A reason for this is that in addition to a diffusion coefficient of silicon carbide itself being small (bond energy between carbon atoms and silicon atoms of silicon carbide is high), a silicide film for ohmic contact with the semiconductor substrate is formed between the semiconductor substrate and the AlSi electrode, whereby mutual diffusion between the silicon atoms in the semiconductor substrate and the aluminum atoms in the AlSi electrode is suppressed.

According to a method proposed as a method of manufacturing a conventional silicon semiconductor device containing silicon as a semiconductor material, the temperature of the semiconductor substrate during the sputtering for the AlSi electrode is set to a temperature that is at most close to a recrystallization temperature of the metal material of the AlSi electrode, whereby deposition of Si nodules is suppressed (for example, refer to Japanese Patent No. 3083301). In Japanese Patent No. 3083301, the temperature of the semiconductor substrate during the sputtering for the AlSi electrode is set to at most 170 degrees C., which is a temperature at which the silicon atoms that diffuse into the AlSi electrode are less prone to form granules, whereby deposition of Si nodules in the AlSi electrode is nearly 0%.

Further, according to another method proposed as a method of manufacturing a conventional silicon semiconductor device, to deposit the AlSi electrode, sputtering is performed continuously in a state with the temperature of the semiconductor substrate set to a low temperature of 150 degrees C. and a state with the temperature set to a high temperature of 350 degrees C. (for example, refer to Japanese Laid-Open Patent Publication No. 2000-164593). In Japanese Laid-Open Patent Publication No. 2000-164593, Si nodules in the AlSi electrode deposited by a low temperature are absorbed by Si nodules in the AlSi electrode deposited at a high temperature and grow, whereby the Si nodules are deposited at an intermediate depth relative to a total thickness of the AlSi electrode and are separate from the barrier metal below.

Further, in another method proposed as a method of manufacturing a conventional silicon semiconductor device, it has been reported that coarse silicon deposits (Si deposits) that are deposited in the AlSi electrode deposited by sputtering are strongly pressed against the semiconductor substrate when a bonding wire is pressure bonded to the AlSi electrode, and cracks that reach the semiconductor substrate are generated from parts to which the Si deposits are pressed (for example, refer to Goto, Hiroshi, et al, "High Strength Al-alloy Electrode Material for Si-IGBT" (Research and Development, KOBE STEEL ENGINEERING REPORTS), KOBELCO, September 2015, Vol. 65, No. 2, pp. 58-61). In Goto, Hiroshi, et al, it is reported that device element destruction or reduced yield may occur due to the generated cracks caused by the Si deposits.

SUMMARY OF THE INVENTION

According to an embodiment of the invention, a silicon carbide semiconductor device includes a semiconductor substrate containing silicon carbide; a bonding wire; and a surface electrode of an aluminum alloy containing silicon, the surface electrode being provided on a surface of the semiconductor substrate, and having a joint portion to which the bonding wire is bonded. The surface electrode has a plurality of silicon nodules formed therein, a number of which are in the joint portion. One of the number of the silicon nodules is of a dendrite structure, and is included at an area percentage of at least 10% relative to a total area of the number of the silicon nodules in the joint portion.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques above are discussed. As described above, in an instance in which silicon carbide is used as a semiconductor material, the embeddability of the AlSi electrode may be enhanced using only sputtering without embedding a W plug by a CVD method. Nonetheless, as a result of intensive research by the inventors, it was found that when the temperature of the semiconductor substrate during the sputtering for the AlSi electrode is set to at least 300 degrees C., Si nodules deposited in the AlSi electrode grow and expand into prismatic crystal grains in a thickness direction (direction orthogonal to and away from the surface of the semiconductor substrate) of the AlSi electrode.

It was found that when the Si nodules in the AlSi electrode expand, in a wire bonding process, damage due to ultrasonic vibration, loads applied to the AlSi electrode, etc. are transmitted to the semiconductor substrate via the Si nodules in the AlSi electrode, cracks reaching an interior of the semiconductor substrate near the Si nodules are generated, and the bonding wire peels from the semiconductor substrate. Goto, Hiroshi, et al report that this problem of cracks occurring in the semiconductor substrate due to Si nodules similarly occurs in an instance in which silicon is used as a semiconductor material.

Further, in an instance in which Si nodules are deposited in the AlSi electrode, when the AlSi electrode is patterned to be left at a predetermined location, Si nodules left on the barrier metal have to be removed by dry etching after the AlSi electrode is removed by wet etching. Nonetheless, to remove the Si nodules that, in the thickness direction of AlSi electrode, have grown into prismatic crystals and expanded to have an increased height, the dry etching time has to be increased and reliability of the barrier metal beneath the AlSi electrode is adversely affected.

In Japanese Patent No. 3083301 described above, the temperature of the semiconductor substrate during the sputtering for the AlSi electrode is low and at most 170 degrees C. whereby a problem arises in that embeddability of the AlSi electrode is poor. In Japanese Laid-Open Patent Publication No. 2000-164593 described above, while the AlSi electrode is deposited by continuously performing sputtering at a low temperature and sputtering at a high temperature, changing the temperature of the semiconductor substrate during the sputtering is difficult. Further, even when the thickness of the AlSi electrode used in a power device is thick, in a range from about 4 μm to 6 μm, and Japanese Laid-Open Patent Publication No. 2000-164593 described above is applied to deposit the AlSi electrode this effect is difficult to obtain.

Embodiments of a silicon carbide semiconductor device and a method of manufacturing a silicon carbide semiconductor device according to the present invention is described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and will not be repeatedly described.

Figure 1:
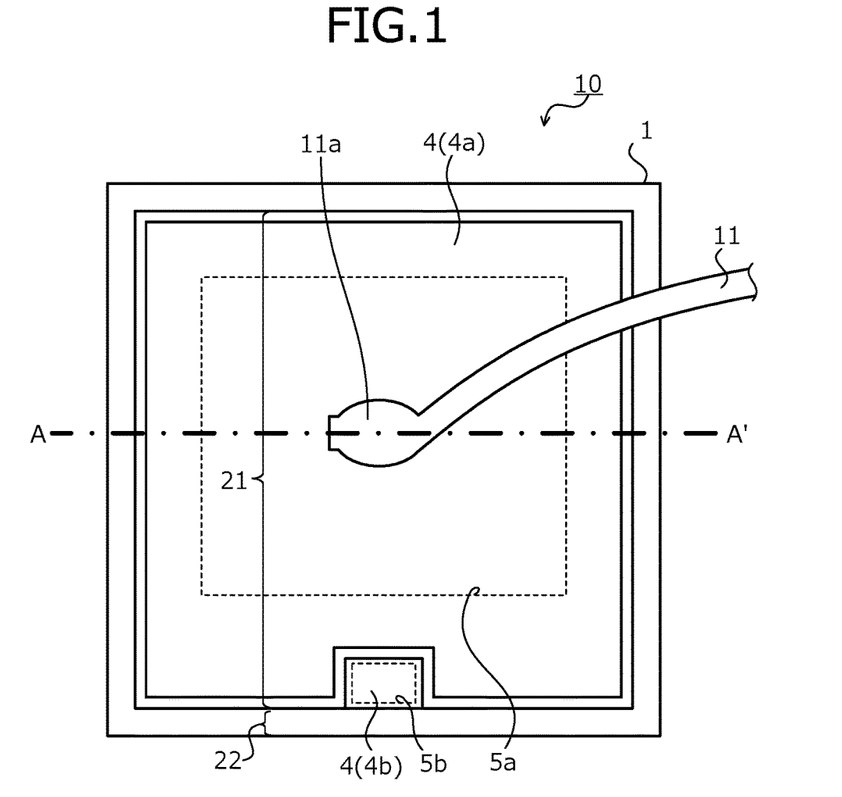
FIG. 1 is a cross-sectional view depicting a layout when a silicon carbide semiconductor device according to an embodiment is viewed from a front side of a semiconductor substrate.
Figure 2:
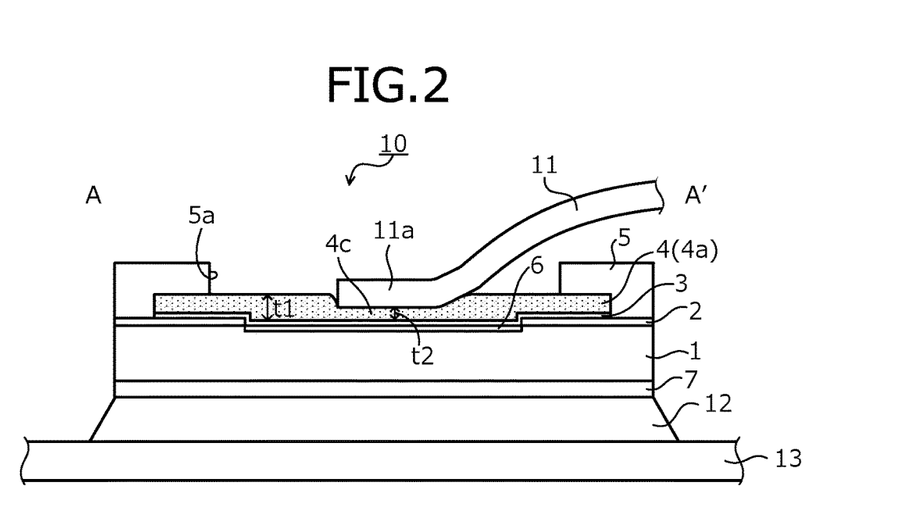
FIG. 2 is a cross-sectional view depicting a structure along cutting line A-A' in FIG. 1.

A structure of a silicon carbide semiconductor device according to an embodiment is described. FIG. 1 is a cross-sectional view depicting a layout when the silicon carbide semiconductor device according to the embodiment is viewed from a front side of a semiconductor substrate. FIG. 1 depicts a state after mounting of a silicon carbide semiconductor device 10. In FIG. 1, openings 5a, 5b of a passivation film 5 are indicated by dashed lines while a solder layer 12 and a mounting substrate 13 are not depicted. FIG. 2 is a cross-sectional view depicting the structure along cutting line A-A' in FIG. 1. In FIG. 2, device element structures (parts in a semiconductor substrate 1) of the silicon carbide semiconductor device 10 are not depicted.

The silicon carbide semiconductor device 10 according to the embodiment depicted in FIGS. 1 and 2 includes on a main surface of the semiconductor substrate (semiconductor chip) 1 that contains silicon carbide (SiC), a surface electrode (hereinafter, AlSi electrode) 4 that has, as an electrode material, an aluminum (Al) alloy containing silicon (Si). While FIGS. 1 and 2 depict, as the silicon carbide semiconductor device 10, a vertical semiconductor device having the AlSi electrode 4 on the front surface of the semiconductor substrate 1, at least one AlSi electrode 4 suffices to be provided on at least one main surface of the semiconductor substrate 1 and the configuration may be variously changed.

The semiconductor substrate 1 may be a bulk substrate cut into individual chips from a semiconductor ingot (single crystal semiconductor rod) or may be an epitaxial substrate in which an epitaxial layer of a predetermined conductivity type is grown on a bulk substrate (starting substrate). The semiconductor substrate 1 has an active region 21 and an edge termination region 22 surrounding a periphery of the active region 21. The active region 21 is a region through which a main current flows when the silicon carbide semiconductor device 10 is ON. The active region 21, for example, is provided in substantially a center of the semiconductor substrate 1.

The edge termination region 22 is a region between the active region 21 and ends of the semiconductor substrate 1 and has a function of mitigating electric field of the front side of the semiconductor substrate 1 and sustaining a breakdown voltage. The breakdown voltage is a voltage limit at which no erroneous operation or destruction of the silicon carbide semiconductor device 10 occurs. In the edge termination region 22, a voltage withstanding structure (not depicted) such as a field limiting ring (FLR), junction termination extension (JTE) structure, etc. is provided.

In the active region 21, on the front surface of the semiconductor substrate 1, at least one (herein, 2) AlSi electrode 4 is provided. FIG. 1 depicts an instance in which the silicon carbide semiconductor device 10 according to the embodiment is a metal oxide semiconductor field effect transistor (MOSFET) having insulated gates with a 3-layer structure including a metal, an oxide film, and a semiconductor and in the MOSFET, one of the AlSi electrodes 4 functioning as a source electrode 4a and the other of the AlSi electrodes 4 functioning as a gate pad 4b are disposed.

Configuration of the AlSi electrodes 4 is described hereinafter. On the front side of the semiconductor substrate 1, as a device element structure of the silicon carbide semiconductor device 10, a general trench gate structure (not depicted) is provided. Reference numeral 2 is an interlayer insulating film or a field insulating film or a stacked film thereof selectively provided on the front surface of the semiconductor substrate 1. Herein, an interlayer insulating film 2 is assumed. A barrier metal 3 may be provided between a surface of the interlayer insulating film 2, the front surface of the semiconductor substrate 1 exposed in a contact hole of the interlayer insulating film 2, and the AlSi electrodes 4.

The barrier metal 3 prevents diffusion of metal atoms to the semiconductor substrate 1 and mutual reactions between regions facing each other across the barrier metal 3 intervening therebetween. Diffusion of aluminum atoms from the AlSi electrodes 4 to the interlayer insulating film 2 is suppressed by the barrier metal 3. The barrier metal 3, for example, is a titanium (Ti) film or a titanium nitride (TiN) film or a stacked metal film thereof. Between the barrier metal 3 (in an instance in which the barrier metal 3 is omitted, the AlSi electrodes 4) and the semiconductor substrate 1, a silicide film 6 forming an ohmic contact with the semiconductor substrate 1 may be provided.

The source electrode 4a, via the barrier metal 3 and the silicide film 6, or via the silicide film 6 alone, is electrically connected to the front surface of the semiconductor substrate 1 and is thereby, electrically connected to an $n^+$-type source region and a $p^{++}$-type contact region exposed at the front surface of the semiconductor substrate 1. The source electrode 4a covers substantially an entire area of the surface of the active region 21 excluding an area in which the gate pad 4b is disposed. A portion of the source electrode 4a is exposed in an opening 5a of the passivation film 5 described hereinafter and functions as the source pad (electrode pad).

The gate pad (electrode pad) 4b, for example, is formed concurrently with the source electrode 4a and is disposed separate from the source electrode 4a, at a same level as the source electrode 4a. The gate pad 4b is electrically connected to all gate electrodes (not depicted) of the MOSFET via a gate runner (not depicted) containing polysilicon (poly-Si). The gate runner is disposed in the edge termination region 22 and surrounds the periphery of the active region 21. The gate pad 4b is exposed in an opening 5b of the passivation film 5.

The front surface of the semiconductor substrate 1 is covered by the passivation film 5. In the openings 5a, 5b of the passivation film 5, the different AlSi electrodes 4 (the source electrode 4a and the gate pad 4b) are exposed, respectively. Each of the openings 5a, 5b of the passivation film 5 has a surface areas that is smaller than the surface area of the respective AlSi electrode 4 exposed thereby. Different bonding wires 11 (the bonding wire 11 of the gate pad 4b not depicted) are respectively bonded to the AlSi electrodes 4 respectively exposed by the openings 5a, 5b of the passivation film 5.

Respective first ends of the bonding wires 11 are bonded to the AlSi electrodes 4, respectively and respective second ends thereof are bonded to leads (not depicted) of a lead frame (the mounting substrate 13 described hereinafter). The bonding wires 11 are pressure bonded to the AlSi electrodes 4 by a general wire bonding method and are crushed at joint portions 11a bonded to the AlSi electrodes 4. The AlSi electrodes 4 are crushed by the bonding wires 11, and a remaining thickness t2 at joint portions 4c bonded to the bonding wires 11 is less than a thickness (thickness during deposition or after patterning (processing)) t1 of other portions of the AlSi electrodes 4.

A surface electrode 7 that functions as a drain electrode is provided in an entire area of the back surface of the semiconductor substrate 1. The surface electrode 7, for example, via the solder layer 12, is bonded on a die pad of the mounting substrate 13 that is a lead frame, whereby the silicon carbide semiconductor device 10 is mounted on the front surface of the mounting substrate 13. The mounting substrate 13, for example, may be a direct copper bond (DCB) substrate in which a circuit pattern formed by a conductive plate such as, for example, copper (Cu) foil, is formed on both sides of a ceramic substrate.

The first ends of the bonding wires 11 are bonded to the semiconductor substrate 1 that is mounted on the mounting substrate 13 and between the mounting substrate 13 and the leads (not depicted) to which the second ends of the bonding wires 11 are bonded, a thermosetting resin such as an epoxy resin is provided so as to cover the semiconductor substrate 1 and the bonding wires 11. In an instance in which a resin case (not depicted) is adhered to a periphery of the mounting substrate 13, an encapsulant such as an epoxy resin is filled between the resin case and the mounting substrate 13, so as to cover the semiconductor substrate 1 and the bonding wires 11.

Figure 3:
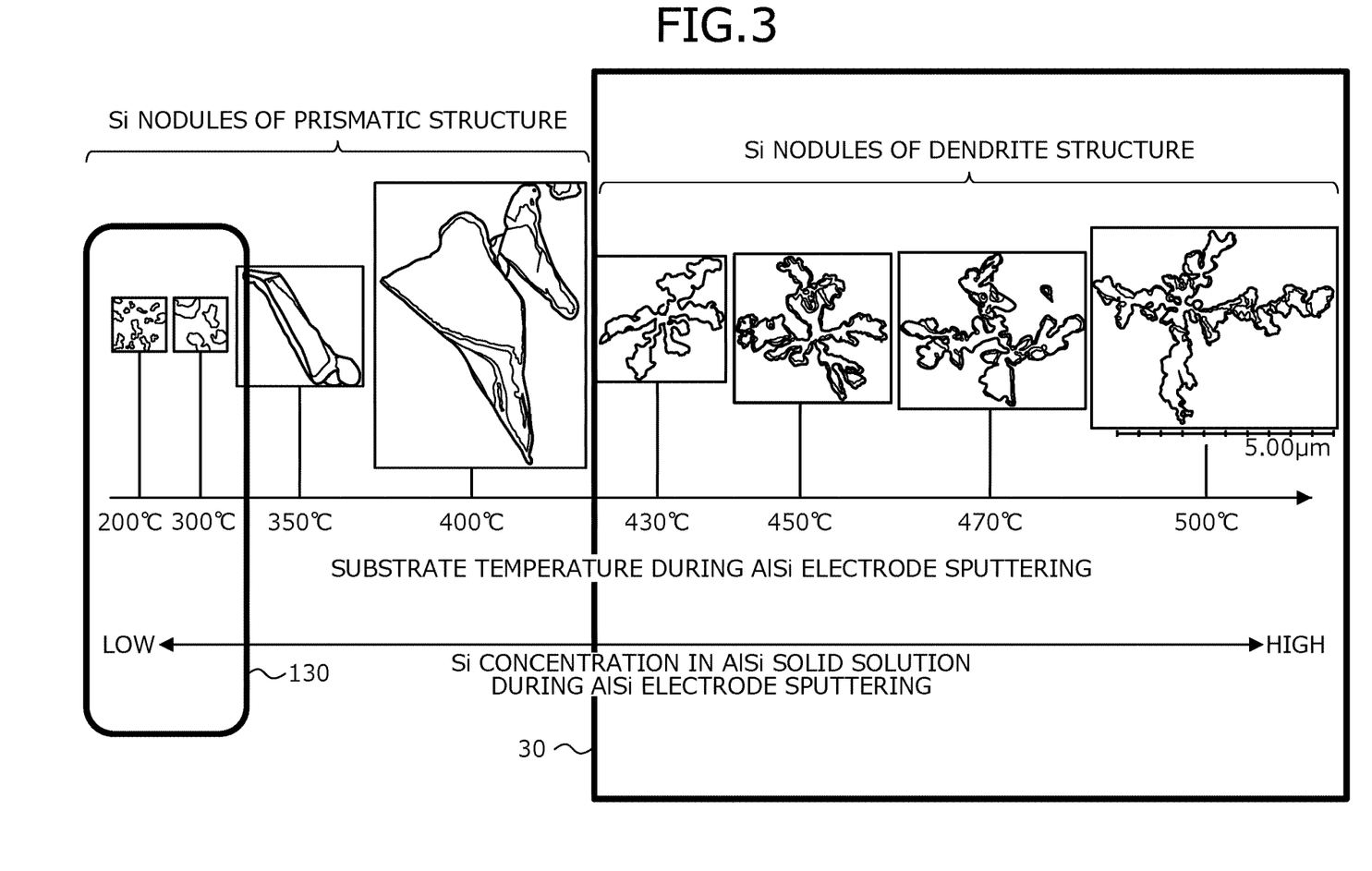
FIG. 3 is a diagram schematically depicting a relationship between temperature of the semiconductor substrate during sputtering for AlSi electrodes and crystal structure of the AlSi electrodes.

Next, a configuration of the AlSi electrodes 4 is described. FIG. 3 is a diagram schematically depicting a relationship between the temperature of the semiconductor substrate during sputtering for the AlSi electrodes and the crystal structure of the AlSi electrodes. The AlSi electrodes 4 are deposited on the barrier metal 3 by sputtering under conditions in which the temperature of the semiconductor substrate 1 or the temperature around formation regions of the AlSi electrodes 4 or both temperatures (hereinafter, the temperature of the semiconductor substrate 1 or the temperature around the formation regions of the AlSi electrodes 4) is at least about 430 degrees C. and a high temperature that is less than a melting point of the electrode material of the AlSi electrodes 4.

The melting point (hardening point) of the electrode material of the AlSi electrodes 4 is a temperature of a liquid phase point (crystallization point on a liquid phase curve) of a eutectic reaction based on the composition of the electrode material of the AlSi electrodes 4 and, for example, is about 530 degrees C. Therefore, the temperature of the semiconductor substrate 1 or the temperature around the formation regions of the AlSi electrodes 4 during the sputtering for the AlSi electrodes 4 is increased, whereby the embeddability of the AlSi electrodes 4 is enhanced and, for example, even during sputtering at a temperature that is at most about 500 degrees C., the AlSi electrodes 4 are not too soft (does not flow) and thus, the thickness t1 of the AlSi electrodes 4 may be maintained.

An upper limit of the thickness t1 of the AlSi electrodes 4 is a limit of the thickness due to deposition accuracy of sputtering equipment or processing performance of dry etching equipment and, for example, is about 5 μm. Preferably, the thickness t1 of the AlSi electrodes 4 may be as thick as possible and by increasing the thickness t1 of the AlSi electrodes 4, conduction loss may be reduced. As described above, the bonding wires 11 are pressure bonded to the AlSi electrodes 4, whereby the remaining thickness t2 of the AlSi electrodes 4 at the joint portions 4c thereof bonded to the bonding wires 11 are the thinnest portions and are, for example, about 2.1 μm (refer to FIG. 7).

The AlSi electrodes 4 contains silicon, for example, in a range from about 0.5 wt % to 3 wt % relative to aluminum. The AlSi electrodes 4 contain silicon, whereby mutual diffusion between silicon atoms in the semiconductor substrate 1 and aluminum atoms in the AlSi electrodes 4 is suppressed, thereby suppressing progress of alloy spikes. The AlSi electrodes 4 may further contain copper (Cu) in a range from about 0.1 wt % to 5 wt % relative to aluminum. Inclusion of copper in the AlSi electrodes 4 enhances the strength of the AlSi electrodes 4. More preferably, the percentage of copper relative to aluminum in the AlSi electrodes 4 may be in a range from about 0.5 wt % to 2 wt %.

Further, the AlSi electrodes 4 include silicon (Si) nodules substantially uniform across surfaces of the AlSi electrodes 4, near an interface between the barrier metal 3 and the AlSi electrodes 4. The Si nodules are silicon deposits (Si crystals) that are crystal grains grown from silicon atoms, as nuclei, the silicon atoms being precipitated from the AlSi electrodes 4 by exceeding the solubility limit of silicon. Each of the AlSi electrodes 4, in at least the joint portion 4c thereof bonded to the respective bonding wire 11, includes Si nodules of a dendrite structure, at an area percentage of at least 10% relative to the total area of the Si nodules in said joint portion 4c.

The AlSi electrodes 4 may include Si nodules of the dendrite structure at the area percentage described above or the AlSi electrodes 4 may include a mixture of Si nodules of the dendrite structure and Si nodules of a structure other than the dendrite structure. Through intensive research by the inventors, it was confirmed that to deposit Si nodules of the dendrite structure at the described area percentage in the AlSi electrodes 4, the temperature of the semiconductor substrate 1 or the temperature around the formation regions of the AlSi electrodes 4 during the sputtering for the AlSi electrodes 4 suffices to be set to at least 430 degrees C. (Si crystals surrounded by rectangular frame 30 in FIG. 3).

The Si nodules of the dendrite structure are silicon (Si) crystals that are crystal grains grown in a dendrite shape extending like tree branches in a direction substantially orthogonal to the thickness direction (direction orthogonal to the surface of the semiconductor substrate 1 and away from the surface of the semiconductor substrate 1) of the AlSi electrodes 4. The Si nodules of a structure other than the dendrite structure are Si nodules of a prismatic structure, the Si nodules being crystal grains grown in a prismatic shape in the thickness direction of the AlSi electrodes 4. The area of a Si nodule is a planar area (surface area) of the Si nodule when viewed from the front side of the semiconductor substrate 1.

For example, in an instance in which silicon is used as a semiconductor material, as described above, the temperature of the semiconductor substrate during the sputtering for the AlSi electrodes is set to less than 300 degrees C. and therefore, substantially all the Si nodules in the AlSi electrodes have a prismatic structure (Si crystals surrounded by rectangular frame 130 in FIG. 3). For example, in an instance in which the temperature of the semiconductor substrate during the sputtering for the AlSi electrodes is at most 400 degrees C., nearly all the Si nodules in the AlSi electrodes have a prismatic structure. Here, the height of the Si nodules of the prismatic structure reaches a maximum of about 5 μm in the thickness direction of the AlSi electrodes 4.

On the other hand, when the temperature of the semiconductor substrate 1 during the sputtering for the AlSi electrodes 4 or the temperature around the formation regions of the AlSi electrodes 4 exceeds 400 degrees C., the precipitate morphology of the Si nodules in the AlSi electrodes 4 changes from the prismatic structure to the dendrite structure. Further, like the present embodiment, by setting the temperature of the semiconductor substrate 1 during the sputtering for the AlSi electrodes 4 or the temperature around the formation regions of the AlSi electrodes 4 to at least 430 degrees C., the Si nodules of the dendrite structure in the AlSi electrodes 4 may be deposited at the area percentage described above.

As the temperature of the semiconductor substrate 1 during the sputtering for the AlSi electrodes 4 or the temperature around the formation regions of the AlSi electrodes 4 increases, the number (area percentage) of the Si nodules of the dendrite structure in the AlSi electrodes 4 increases. As the number of the Si nodules of the dendrite structure increases, the number of the Si nodules of the prismatic structure in the AlSi electrodes 4 decreases. In the AlSi electrodes 4 (in AlSi solid solution) during the sputtering, the silicon concentration in the Si nodules of the dendrite structure is higher than the silicon concentration in the Si nodules of the prismatic structure.

The height (height in the thickness direction of the AlSi electrodes 4) of the Si nodules in the AlSi electrodes 4 is at most about 2 μm for the Si nodules of the dendrite structure and for the Si nodules of the prismatic structure, and less than the remaining thickness t2 of the AlSi electrodes 4

Figure 4:
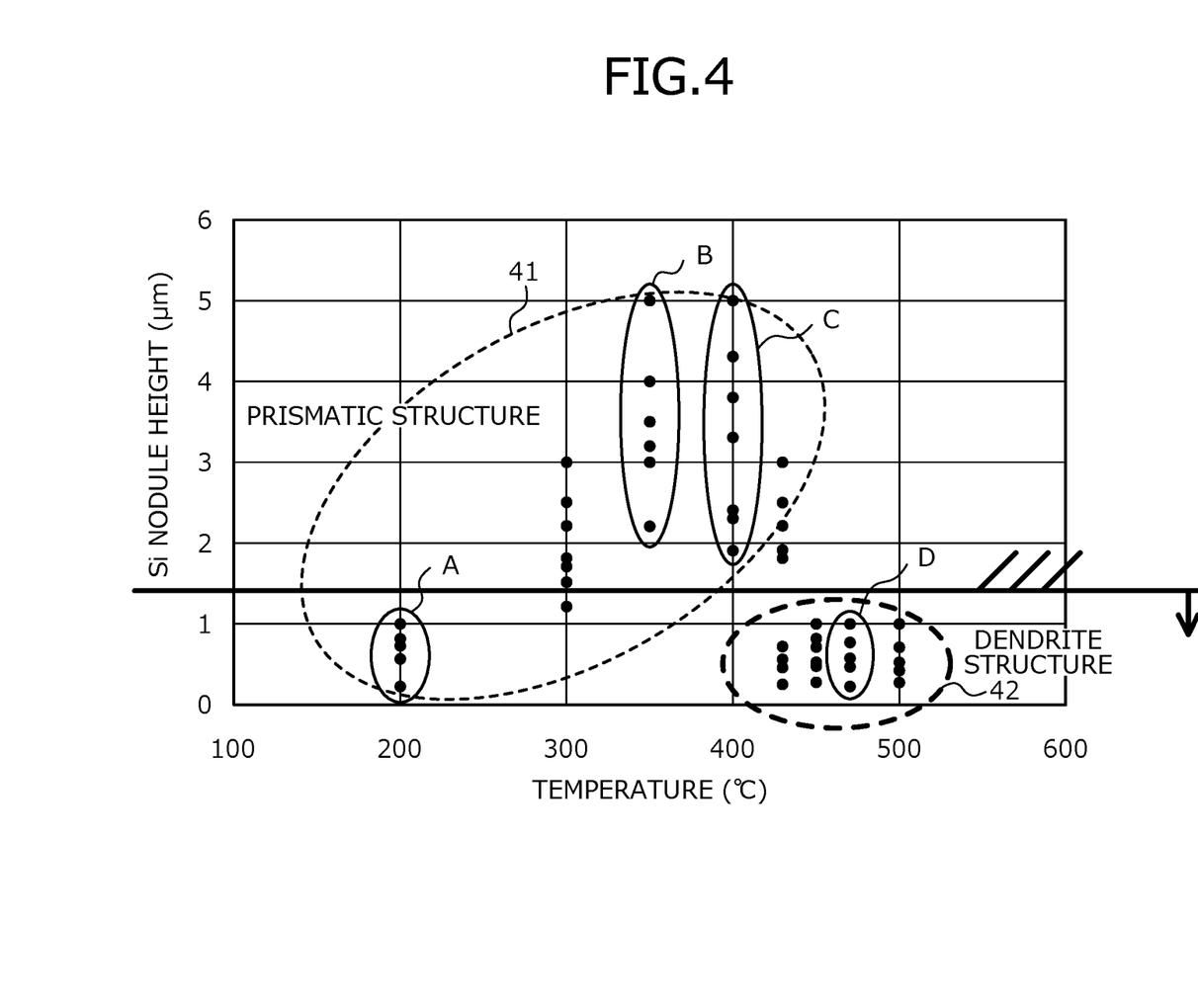
FIG. 4 is a characteristics diagram depicting a relationship between the temperature of the semiconductor substrate during the sputtering for the AlSi electrodes in a first experimental example and a height of Si nodules in the AlSi electrodes.
Figure 5A:
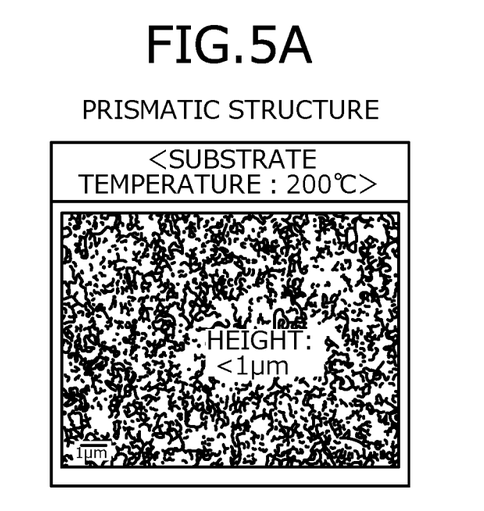
FIG. 5A is a plan view schematically depicting a state when the Si nodule of sample A in FIG. 4 is viewed from the front side of the semiconductor substrate.
Figure 5B:
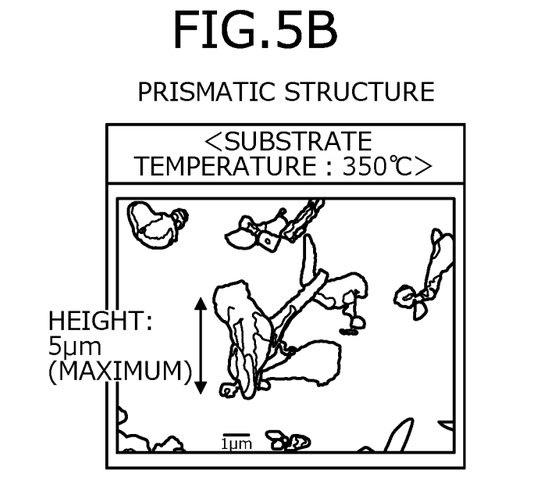
FIG. 5B is a plan view schematically depicting a state when the Si nodule of sample B in FIG. 4 is viewed from the front side of the semiconductor substrate.
Figure 5C:
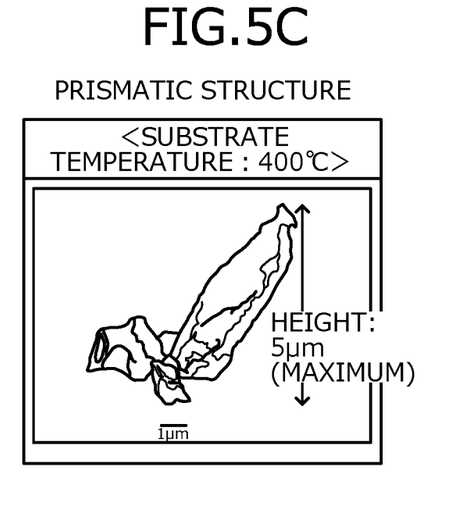
FIG. 5C is a plan view schematically depicting a state when the Si nodule of sample C in FIG. 4 is viewed from the front side of the semiconductor substrate.
Figure 5D:
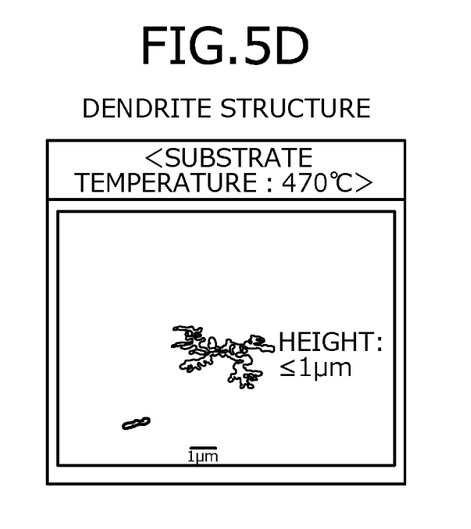
FIG. 5D is a plan view schematically depicting a state when the Si nodule of sample D in FIG. 4 is viewed from the front side of the semiconductor substrate.
Figure 6:
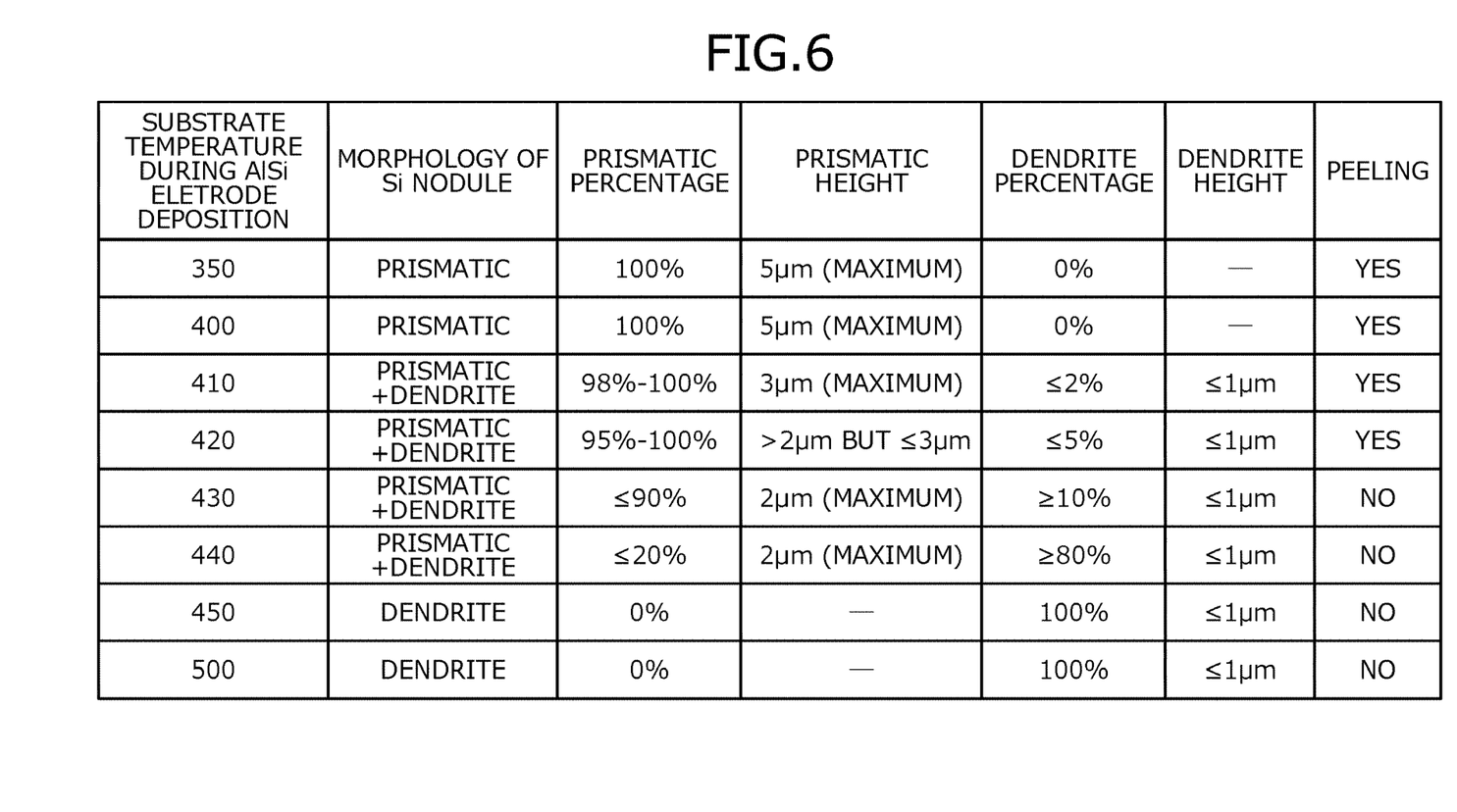
FIG. 6 is a table depicting a relationship between the temperature of the semiconductor substrate during the sputtering for AlSi electrodes in a first experimental example and an area percentage of the Si nodules in the AlSi electrodes.

(refer to FIGS. 4 to 6). In addition to the Si nodules of the dendrite structure only growing to a height of at most 1 μm, as described above, the precipitate morphology of the Si nodules during the sputtering for the AlSi electrodes 4 changes from the prismatic structure to the dendrite structure and thus, the Si nodules of the prismatic structure do not grow larger than 2 μm.

Next, a method of manufacturing the silicon carbide semiconductor device 10 according to the embodiment is described. First, a semiconductor wafer containing silicon carbide is prepared. A predetermined device element structure is formed on a front side of a region of the semiconductor wafer that becomes a semiconductor chip (the semiconductor substrate 1) after dicing (cutting). For example, in an instance in which the silicon carbide semiconductor device 10 according to the embodiment is an n-type channel vertical MOSFET, the predetermined device element structure is insulated gate (MOS gate) structure formed by a p-type base region, an $n^+$-type source region, a $p^{++}$-type contact region, a gate insulating film, and a gate electrode.

Next, on the front surface of the semiconductor wafer, the interlayer insulating film 2 is formed and is selectively removed, whereby a predetermined contact hole is formed in the interlayer insulating film 2. Next, the silicide film 6 is formed in ohmic contact with a portion of the front surface of the semiconductor wafer exposed in the contact hole of the interlayer insulating film 2. Next, the barrier metal 3 is formed on the surface of the interlayer insulating film 2 and on the surface of the silicide film 6. In an instance in which the barrier metal 3 is a stacked metal film, before formation of the silicide film 6, the surface of the interlayer insulating film 2 alone may be covered and protected by a lower metal film of the barrier metal 3.

Next, the semiconductor wafer is placed on a stage of a general sputtering apparatus (not depicted) with the back surface of the semiconductor wafer facing stage and, for example, is held on the stage by an electric static chuck (ESC) or the like. Next, for example, an interior of a chamber (treatment furnace) of the sputtering apparatus or the stage is heated by a heating means such as a heater, whereby the temperature of the semiconductor wafer or the temperature around the formation regions of the AlSi electrodes 4 is raised to at least 430 degrees C. and the AlSi electrodes 4 are deposited on the barrier metal 3 by sputtering in this state.

Next, the semiconductor wafer is removed from the stage of the sputtering apparatus and is left under a normal temperature environment (state in which neither active heating nor cooling is performed) to cool, whereby the temperature of the semiconductor wafer is reduced. In this manner, the temperature of the semiconductor wafer during the sputtering for the AlSi electrodes 4 or the temperature around the formation regions of the AlSi electrodes 4 is set to at least 430 degrees C. and after the sputtering, the semiconductor wafer is cooled under a normal temperature environment, whereby the AlSi electrodes 4 containing the Si nodules of the dendrite structure at the predetermined area percentage described above are formed.

Additionally, the height of the Si nodules in the AlSi electrodes 4 is at most about 2 μm for the Si nodules of the dendrite structure and for the Si nodules of the prismatic structure. Next, the AlSi electrodes 4 are etched (patterned) and left at predetermined locations using general dry etching equipment. The AlSi electrodes 4 left in the predetermined locations after the patterning correspond to the source electrode 4a and the gate pad 4b in FIG. 1. Next, a device element structure is formed on the back side of the semiconductor wafer and the surface electrode 7 is formed on the back surface of the semiconductor wafer.

Next, the semiconductor wafer is diced into individual chips (the semiconductor substrate 1), whereby the silicon carbide semiconductor device 10 according to the embodiment in FIGS. 1 and 2 is completed. Next, the surface electrode 7 of the semiconductor substrate 1, via the solder layer 12, for example, is bonded on a wiring layer constituting a lead or the die pad of the mounting substrate 13 constituting the lead frame, whereby the silicon carbide semiconductor device 10 is mounted on the front surface of the mounting substrate 13. Next, by a general wire bonding process, the bonding wires 11 are press-fitted and bonded to the AlSi electrodes 4 of the semiconductor substrate 1.

Here, the remaining thickness t2 of the AlSi electrodes 4 at the joint portions 4c thereof bonded to the bonding wires 11 is less than the thickness t1 of the other portions of the AlSi electrodes 4 and, for example, is about 2.1 μm; nonetheless, unlike the conventional method, peeling of the bonding wires 11 does not occur. A reason for this is that, as described above, the AlSi electrodes 4 include the Si nodules of the dendrite structure at the predetermined area percentage described above and the height of the Si nodules in the AlSi electrodes 4 is at most about 2 μm. In this manner, a semiconductor package in which the silicon carbide semiconductor device 10 is mounted is completed.

A relationship between the temperature of the semiconductor substrate 1 during the sputtering for the AlSi electrodes 4 and the height of the Si nodules was verified. FIG. 4 is a characteristics diagram depicting a relationship between the temperature of the semiconductor substrate during the sputtering for the AlSi electrodes in a first experimental example and the height of the Si nodules in the AlSi electrodes. FIGS. 5A, 5B, 5C, and 5D are plan views schematically depicting states when the Si nodules of samples A, B, C, and D in FIG. 4 are viewed from the front side of the semiconductor substrate. FIG. 6 is a table depicting a relationship between the temperature of the semiconductor substrate during the sputtering for the AlSi electrodes in the first experimental example and the area percentage of the Si nodules in the AlSi electrodes.

Multiple samples (hereinafter, the first experimental example) were prepared in which AlSi electrodes having a thickness of 5 μm were deposited on a semiconductor substrate (semiconductor chip) containing silicon carbide, by changing the temperature of the semiconductor substrate and performing sputtering. Multiple samples were fabricated for each temperature of the semiconductor substrate at the time the sputtering of the AlSi electrodes. The AlSi electrodes of all of the samples were wet-etched to expose the Si nodules and dimensions of the Si nodules viewed from the front side of the semiconductor substrate and the height (the height in the thickness direction of the AlSi electrodes) of the Si nodules were measured.

The relationship between the temperature of the semiconductor substrate during the sputtering for the AlSi electrodes of the first experimental example and the height of the Si nodules in the AlSi electrode is depicted in FIG. 4. The Si nodules in the AlSi electrodes of the samples A to D in which the temperature of the semiconductor substrate during the sputtering for the AlSi electrodes of the first experimental example was set to 200 degrees C., 350 degrees C., 400 degrees C., and 470 degrees C., respectively, were observed from the front side of the semiconductor substrate under a scanning electron microscope (SEM) and respective states thereof are schematically depicted in FIGS. 5A to 5D.

Results of calculation of the area percentage of the Si nodules of the AlSi electrodes of the first experimental example are shown in FIG. 6. FIG. 6 shows the temperature of the semiconductor substrate during the sputtering (during the deposition) of the AlSi electrodes, the precipitate morphology (prismatic, dendrite) of the Si nodules, the area percentage and the height of the Si nodules of the prismatic structure (in FIG. 6, respective prismatic percentages and prismatic heights are shown), the area percentage and the height of the Si nodules of the dendrite structure (in FIG. 6, respective dendrite percentages and dendrite heights are shown), and presence of bonding wire peeling (yes, no).

From the results shown in FIGS. 4 to 6, it was confirmed that in an instance in which the temperature of the semiconductor substrate during the sputtering for the AlSi electrodes is less than 430 degrees C., all the Si nodules in the AlSi electrodes have a prismatic structure (portion surrounded by frame 41 in FIG. 4; prismatic percentage: 100%, refer to FIGS. 5A to 5C). Further, it was confirmed that in an instance in which the temperature of the semiconductor substrate during the sputtering for the AlSi electrodes is in a range from 350 degrees C. to 400 degrees C., the bonding wires bonded to the AlSi electrodes peel (in FIG. 6, bonding wire peeling: "yes"). The height of the Si nodules of the prismatic structure at this time was confirmed to reach a maximum of 5 µm (refer to FIGS. 5B, 5C).

It was confirmed that when the temperature of the semiconductor substrate during the sputtering for the AlSi electrodes exceeds 400 degrees C., Si nodules of prismatic structure and Si nodules of the dendrite structure are both present in the AlSi electrodes; however, in an instance in which the temperature of the semiconductor substrate during the sputtering for the AlSi electrodes is less than 430 degrees C., peeling of the bonding wires bonded to the AlSi electrodes was confirmed. It was confirmed that the area percentage (dendrite percentage) of the Si nodules of the dendrite structure in the AlSi electrodes at this time is less than 10% and the height (prismatic height) of the Si nodules of prismatic structure exceeded 2 µm (refer to FIG. 6).

It was confirmed that in an instance in which the temperature of the semiconductor substrate during the sputtering for the AlSi electrodes is less than 300 degrees C., all the Si nodules in the AlSi electrodes were prismatic structure; however, the height of the Si nodules of the prismatic structure was at most 1 µm (refer to FIGS. 4 and 5A, not depicted in FIG. 6). While peeling of the bonding wires bonded to the AlSi electrodes did not occur, it was confirmed that in an instance in which the aspect ratio of the contact holes of the interlayer insulating films was large, the AlSi electrodes could not be embedded in the contact holes by sputtering.

On the other hand, it was confirmed that in an instance in which the temperature of the semiconductor substrate during the sputtering for the AlSi electrodes is at least 430 degrees C. (portion surrounded by frame 42 in FIG. 4), peeling of the bonding wires bonded to the AlSi electrodes did not occur (bonding wiring peeling "no" in FIG. 6). It was confirmed that the area percentage (dendrite percentage) and the height (dendrite height) of the Si nodules of the dendrite structure in the AlSi electrodes at this time were at most 10% and at most 1 µm, respectively, and the height (prismatic height) of the Si nodules of the prismatic structure was a maximum of 2 µm.

In other words, in FIG. 6, the AlSi electrodes of the samples for which the temperature of the semiconductor substrate during the sputtering for the AlSi electrodes was at least about 430 degrees C. are equivalent to the AlSi electrodes 4 of the present embodiment. In FIG. 6, as the area percentages of the Si nodules, the percentages of the prismatic structure (prismatic percentage) and the dendrite structure (dendrite percentage) and the percentage of the total area of the Si nodules relative to the area (surface area) of an entire area of the surface of the AlSi electrode are shown; however, similar results are obtained even in an instance of the area percentage of the Si nodules relative to the area of a portion (for example, contact portion in contact with the bonding wire) of the AlSi electrode.

Further, it was confirmed that by setting the temperature of the semiconductor substrate during the sputtering for the AlSi electrodes to be at least 430 degrees C., even when the aspect ratio of the contact holes of the interlayer insulating film is large, the AlSi electrodes can be embedded in the contact holes by sputtering. Therefore, it was confirmed that by setting the temperature of the semiconductor substrate during the sputtering for the AlSi electrodes to be at least 430 degrees C., embeddability of the AlSi electrodes by sputtering may be enhanced and peeling of bonding wires may be prevented.

Figure 7:
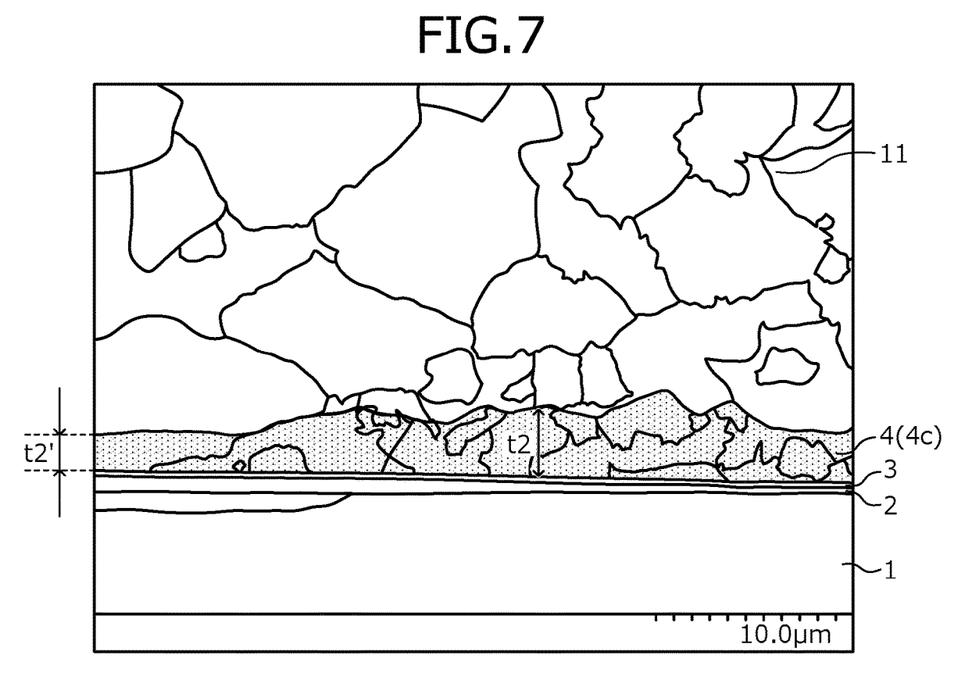
FIG. 7 is a cross-sectional view schematically depicting a joint portion of an AlSi electrode of a second experimental example, the joint portion to which a bonding wire is bonded.

The remaining thickness t2 of the AlSi electrodes 4 at the joint portions 4c thereof bonded to the bonding wires 11 was verified. FIG. 7 is a cross-sectional view schematically depicting a joint portion of an AlSi electrode of a second experimental example, the joint portion to which a bonding wire is bonded. According to the method of manufacturing the silicon carbide semiconductor device according to the embodiment described above, a sample (hereinafter, the second experimental example) was prepared by depositing the AlSi electrode 4 having a thickness of 5 µm on the semiconductor substrate 1 by sputtering and bonding the bonding wire 11 containing aluminum to the AlSi electrode 4 by wiring bonding.

A state when the joint portion 4c of the AlSi electrode 4 (hatched portion) to which the bonding wire 11 is bonded in this sample is viewed from a direction parallel to the front surface of the semiconductor substrate 1 by SEM is schematically depicted in FIG. 7. From the results shown in FIG. 7, it was confirmed that the AlSi electrode 4 is crushed by the bonding wire 11 and at a portion of the joint portion 4c where the remaining thickness t2 of the joint portion 4c is thinnest, a thickness t2' of about 2.1 µm, which is about half of the thickness (the thickness during deposition or after patterning (processing)) t1 of the other portions of the AlSi electrode 4 was confirmed.

As described above, according to the embodiment, Si nodules are deposited in the AlSi electrode; and the AlSi electrode, at least in a joint portion thereof bonded to the bonding wire, includes Si nodules of the dendrite structure at an area percentage of at least 10% relative to the total area of the Si nodules in the joint portion. As a result, the height of the Si nodules in the AlSi electrode is at most 2 µm, which is less than the thickness of the portion (joint portion of the AlSi electrode to which the bonding wire is bonded) of the AlSi electrode crushed and made thinner by the bonding wire.

As a result, the Si nodules in the AlSi electrode are not pressed against the semiconductor substrate by the bonding wire and therefore, generation of cracks that reach the interior of the semiconductor substrate and bonding wire peeling may be suppressed. Accordingly, yield may be increased. Further, according to the embodiment, by setting the temperature of the semiconductor substrate during the sputtering for the AlSi electrodes or the temperature around the formation region of the AlSi electrode to be at least 430 degrees C., the embeddability of the AlSi electrode may be enhanced, thereby enabling the yield to be enhanced.

In the foregoing, the present invention is not limited to the embodiments described above and various modifications are possible within a range not departing from the spirit of the invention.

According to the invention described above, silicon nodules in the AlSi electrode (surface electrode) are not pressed against the semiconductor substrate by the bonding wire and therefore, generation of cracks reaching the interior of the semiconductor substrate and bonding wire peeling may be suppressed. Further, according to the invention described above, the temperature of the semiconductor substrate during the sputtering for the AlSi electrodes or the temperature around the formation region of the AlSi electrode is set to be at least 430 degrees C., whereby embeddability of the AlSi electrode may be enhanced.

The silicon carbide semiconductor device and the method of manufacturing a silicon carbide semiconductor device according to the present invention achieve an effect in that yield may be enhanced for silicon carbide semiconductor devices having an AlSi electrode.

As described above, the silicon carbide semiconductor device and the method of manufacturing a silicon carbide semiconductor device according to the present invention are useful for power semiconductor devices used in power converting equipment, power source devices such as those in industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate containing silicon carbide;
a bonding wire; and
a surface electrode of an aluminum alloy containing silicon, the surface electrode being provided on a surface of the semiconductor substrate, and having a joint portion to which the bonding wire is bonded, wherein
the surface electrode has a plurality of silicon nodules formed therein, a number of which are in the joint portion, and
one of the number of the silicon nodules is of a dendrite structure, and is included at an area percentage of at least 10% relative to a total area of the number of the silicon nodules in the joint portion.

2. The silicon carbide semiconductor device, according to claim 1, wherein
a maximum height of the silicon nodules in the surface electrode is less than a thickness of the surface electrode.

3. The silicon carbide semiconductor device according to claim 2, wherein
the thickness of the surface electrode is smaller at the joint portion than at portions thereof other than the joint portion, and
the maximum height of the silicon nodules in the surface electrode is less than the thickness of the surface electrode at the joint portion.

4. The silicon carbide semiconductor device according to claim 1, wherein
a maximum height of the silicon nodules in the surface electrode is at most 2 um.

5. The silicon carbide semiconductor device according to claim 1, wherein
in the surface electrode, the silicon is in a range from 0.5 wt % to 3 wt % relative to aluminum.

6. The silicon carbide semiconductor device according to claim 1, further comprising
a barrier metal provided between the semiconductor substrate and the surface electrode, the barrier metal preventing
a first diffusion of impurity atoms from the semiconductor substrate to the surface electrode,
a second diffusion of the impurity atoms from the surface electrode to the semiconductor substrate, or both the first diffusion and the second diffusion.

7. The silicon carbide semiconductor device according to claim 1, further comprising
a silicide film provided between the semiconductor substrate and the surface electrode, the silicide film being in ohmic contact with the semiconductor substrate.

8. A method of manufacturing a silicon carbide semiconductor device, comprising:
providing a semiconductor substrate containing silicon carbide;
depositing a surface electrode on a surface of the semiconductor substrate by a sputtering process, the surface electrode being of an aluminum alloy containing silicon, wherein
in the sputtering process, a first temperature of the semiconductor substrate, a second temperature around a formation region of the surface electrode, or both the first temperature and the second temperature, are in a range from 430 degrees C. to 500 degrees C.; and
bonding a bonding wire to the surface electrode at a joint portion thereof, wherein
the surface electrode has a plurality of silicon nodules formed therein, a number of which are in the joint portion, and
one of the number of silicon nodules is of a dendrite structure, and has an area percentage of at least 10% relative to a total surface area of the number of the silicon nodules in the joint portion.

* * * * *